US006413819B1

(12) United States Patent
Zafar et al.

(10) Patent No.: US 6,413,819 B1
(45) Date of Patent: Jul. 2, 2002

(54) MEMORY DEVICE AND METHOD FOR USING PREFABRICATED ISOLATED STORAGE ELEMENTS

(75) Inventors: Sufi Zafar; Ramachandran Muralidhar; Bich-Yen Nguyen; Sucharita Madhukar; Daniel T. Pham; Michael A. Sadd; Chitra K. Subramanian, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/595,821

(22) Filed: Jun. 16, 2000

(51) Int. Cl.$^7$ .............................................. H01L 21/336
(52) U.S. Cl. ...................................... 438/257; 438/782
(58) Field of Search ................................ 438/128, 165, 438/166, 197, 211, 257, 263, 264, 265, 266, 448, 680, 752, 775, 753, 782, 786, 787, 963, 311

(56) References Cited

U.S. PATENT DOCUMENTS

| 3,878,549 A |   | 4/1975 | Yamazaki et al. |
| 6,060,743 A | * | 5/2000 | Sugiyama et al. ........... 257/321 |
| 6,090,666 A | * | 7/2000 | Ueda et al. ................. 438/257 |
| 6,140,181 A |   | 10/2000 | Forbes et al. |
| 6,166,401 A | * | 12/2000 | Forbes ......................... 257/77 |
| 6,208,000 B1 |  | 3/2001 | Tanamoto et al. |
| 6,310,376 B1 |  | 10/2001 | Ueda et al. |

FOREIGN PATENT DOCUMENTS

| EP | 0971416 A1 | 1/2000 |
| JP | 11-111869 | 4/1999 |

OTHER PUBLICATIONS

Wahl et al., "Write, Erase and Storage Times in Nanocrystal Memories and the Role of Interface States," IEEE, pp. 15.4.1–15.4.4 (1999).
Kim, et al. "Room Temperature Single Electron Effects in Si Quantum Dot Memory with Oxide–Nitride Tunneling Dielectrics," IEEE, 4 pgs. (1998).

* cited by examiner

Primary Examiner—David Nelms
Assistant Examiner—David Nhu
(74) Attorney, Agent, or Firm—James L. Clingan, Jr.

(57) ABSTRACT

A semiconductor device that includes a floating gate made up of a plurality of pre-formed isolated storage elements (18) and a method for making such a device is presented. The device is formed by first providing a semiconductor layer (12) upon which a first gate insulator (14) is formed. A plurality of pre-fabricated isolated storage elements (18) is then deposited on the first gate insulator (14). This deposition step may be accomplished by immersion in a colloidal solution (16) that includes a solvent and pre-fabricated isolated storage elements (18). Once deposited, the solvent of the solution (16) can be removed, leaving the pre-fabricated isolated storage elements (18) deposited on the first gate insulator (14). After depositing the pre-fabricated isolated storage elements (18), a second gate insulator (20) is formed over the pre-fabricated isolated storage elements (18). A gate electrode (24) is then formed over the second gate insulator (20), and portions the first and second gate insulators and the plurality of pre-fabricated isolated storage elements that do not underlie the gate electrode are selectively removed. A source region (32) and a drain region (34) are then formed in the semiconductor layer (12) such that a channel region is formed between underlying the gate electrode (24).

21 Claims, 2 Drawing Sheets

MEMORY DEVICE AND METHOD FOR USING PREFABRICATED ISOLATED STORAGE ELEMENTS

CROSS-REFERENCE TO RELATED APPLICATIONS

Related subject matter is disclosed in U.S. application Ser. No. 09/595,753 entitled "Memory Device and Method for Manufacture," U.S. application Ser. No. 09/596,399 entitled "Memory Device That Includes Passivated Nanoclusters and Method for Manufacture," and U.S. application Ser. No. 09/595,830 entitled "Memory Device Including Nanoclusters Deposited on a Modified Tunnel Dielectric Layer and Method for Manufacture," filed simultaneously herewith and assigned to the assignee hereof.

FIELD OF THE INVENTION

The invention relates generally to semiconductor devices and more particularly to a semiconductor memory device and a process for forming such a semiconductor memory device.

BACKGROUND OF THE INVENTION

Electrically erasable programmable read only memory (EEPROM) structures are commonly used in integrated circuits for non-volatile data storage. As is known, EEPROM device structures commonly include a floating gate that has charge storage capabilities. Charge can be forced into the floating gate structure or removed from the floating gate structure through the use of control voltages. The conductivity of the channel underlying the floating gate is significantly reduced by the presence of charges stored in the floating gate. The difference in conductivity due to a charged or uncharged floating gate can be current sensed, thus allowing binary memory states can be determined. The conductivity difference is also represented by shift in the threshold voltage ($V_T$) associated with the device in the two different states where charge is either stored or not stored on the floating gate.

As semiconductor devices continue to evolve, the operating voltages of such semiconductor devices are often reduced in order to suit low power applications. It is desirable for such operating voltage reductions to be accomplished while ensuring speed and functionality of the devices. A controlling factor in the operating voltages required to program and erase devices with floating gates is the thickness of the tunnel oxide through which carriers are exchanged between the floating gate of the device and the underlying channel region.

In many prior art devices, the floating gate is constructed from a uniform layer of material such as doped polysilicon. In such prior art device structures, a thin tunnel oxide layer beneath the floating gate presented the potential problem of charge leakage from the floating gate to the underlying channel through defects in the thin tunnel oxide layer. Such charge leakage leads to degradation of the memory state stored within the device and is therefore undesirable. In order to avoid such charge leakage, tunnel oxide thickness was often increased. However, thicker tunnel oxide dielectric requires higher (programming and erasing) voltages for storing and removing charge from the floating gate as the charge carriers must pass through the thicker tunnel dielectric. In many cases, higher programming voltages require the implementation of charge pumps on integrated circuits in order to increase the supply voltage to meet programming voltage requirements. Such charge pumps consume a significant amount of die area for the integrated circuit and therefore reduce the memory array area efficiency and increase overall costs.

In order to reduce the required thickness of the tunnel dielectric (which may also be referred to as the tunnel oxide) and improve the area efficiency of the memory structures by eliminating the need for charge pumps, the uniform layer of material used for the floating gate may be replaced with a plurality of isolated storage elements. These isolated storage elements together provide adequate charge storage capacity while remaining physically isolated from each other such that any leakage occurring with respect to a single storage element does not cause charge to be drained from additional storage elements. As such, thinner tunnel oxides can be used in device structures and the effects of leakage occurring in such thin tunnel oxide devices does not cause the loss of state information that occurs in transistors that include a continuous-layer floating gate.

A limiting factor in construction of devices that include floating gates made up of a plurality of isolated storage elements relates to controlling the size, density, and uniformity of the isolated storage elements within the floating gate structure. The density of the isolated storage elements is important in the determination of the change in the threshold voltage for the device between the states where the floating gate is charged or discharged. Higher densities are desirable as they lead to an increased change in threshold voltage when the charge density per storage element is fixed. Prior art techniques for forming isolated storage elements on the tunnel oxide were limited to a density of approximately $5 \times 10^{11}$ isolated storage elements per $cm^2$. With such a limited density of isolated storage elements, the charge density per storage element, or number of carriers that each storage element must retain, is forced to an elevated level to ensure a sufficient threshold voltage shift that can be robustly sensed. However, this typically leads to charge loss from individual storage elements, thus degrading the overall charge retention characteristics of the floating gate. In addition to this limitation, the limited charge storage element density of prior art devices requires longer programming times as a longer time period is required for forcing subsequent charge carriers into each storage element after an initial carrier has been stored, and the time required continues to increase as the charge density per storage element is elevated.

The techniques used for forming the isolated storage elements in such prior art devices that are limited in storage element density typically involves techniques such as low pressure chemical vapor deposition (LPCVD) and recrystallization of a thin amorphous layer of material to form the isolated storage elements. Both of these techniques require control of nucleation and growth kinetics. Since nucleation and growth kinetics typically occur concurrently, and the control of size and density of the isolated storage elements that are formed as a result of these steps is difficult.

Therefore, a need exists for a method for including isolated storage elements within semiconductor devices in a manner that provides a high density of storage elements while maintaining control over the size dispersion of the storage elements.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention provides a semiconductor device that includes a floating gate made up of a plurality of pre-formed isolated storage elements and a method for making such a device. The device is formed by first providing a semiconductor layer upon which a first gate insulator is formed. A plurality of pre-fabricated isolated storage elements is then deposited on the first gate insulator. This deposition step may be accomplished by immersion in a colloidal solution that includes a solvent and pre-fabricated isolated storage elements. Once deposited, the solvent of the solution can be removed, leaving the pre-fabricated isolated storage elements deposited on the first gate insulator. After depositing the pre-fabricated isolated storage elements, a second gate insulator is formed over the pre-fabricated isolated storage elements. A gate electrode is then formed over the second gate insulator, and portions of the first and second gate insulators and the plurality of pre-fabricated isolated storage elements that do not underlie the gate electrode are selectively removed. After formation of spacers, source and drain regions are formed in the semiconductor layer such that a channel region is formed between the source and drain regions underlying the gate electrode.

By forming the floating gate of the semiconductor device using a pre-fabricated isolated storage elements, the density of the pre-fabricated isolated storage elements included in the floating gate structure can be closely controlled. Because the pre-fabricated isolated storage elements, which may be nano-crystals or nanoclusters, are created prior to deposition, their size can also be closely controlled by sorting a set of pre-fabricated isolated storage elements based on size and selecting the desired size after sorting. Suspending the pre-fabricated isolated storage elements in a colloidal solution using well known techniques in colloid science provides a solution that can be uniformly applied to the surface of the gate insulator included in the semiconductor device. Using such a deposition technique, the density of pre-fabricated isolated storage elements that may be achieved greatly exceeds that possible using prior art techniques for forming the pre-fabricated isolated storage elements during substrate processing. This increase in density provides a number of benefits including an increased threshold voltage shift ($\Delta V_T$), reduced statistical fluctuations within the area making up each floating gate, and better charge retention and programming speed at a fixed $\Delta V_T$ level.

Figure 1:
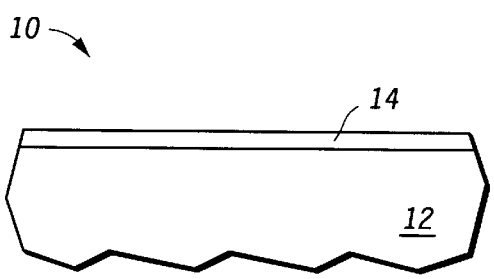
FIG. 1 illustrates a cross-sectional view of a portion of a semiconductor substrate that includes a formed layer of tunnel dielectric.

The invention can be better understood with reference to FIGS. 1–12. FIGS. 1–9 illustrate a series of cross-sectional views representing different steps involved in making a semiconductor device, such as a transistor, that may be used in a memory structure such as EEPROM. FIG. 1 illustrates a cross-sectional view of a portion of a semiconductor device 10 that includes a semiconductor layer 12, which may be silicon, over which a first gate insulator layer 14, which may also be referred to as tunnel dielectric, has been formed. The first gate insulator layer 14 may be silicon dioxide, nitrided oxide, or other high-dielectric constant materials. The first gate insulator layer 14 may be thermally grown or deposited, and the thickness of the first gate insulator layer 14 may be on the order of less than 50 Angstroms.

Figure 2:
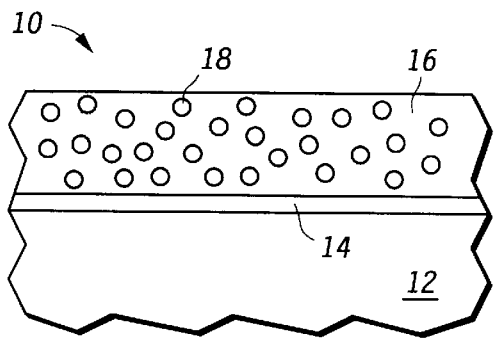
FIG. 2 illustrates a cross-sectional view of the portion of the semiconductor substrate of FIG. 1 partially emersed in a colloidal solution containing pre-fabricated isolated storage elements in accordance with a particular embodiment of the present invention.

FIG. 2 illustrates a cross-sectional view of the portion of the semiconductor device 10 as formed in FIG. 1 where the surface of the first gate insulator layer 14 is exposed to a colloidal solution such that a layer of colloidal solution 16 is formed on the surface. Colloidal solution 16 is a solution that contains a solvent and a plurality of nano-crystals, which may be a plurality of pre-fabricated isolated storage elements 18. Such pre-fabricated isolated storage elements 18 may be made of silicon, germanium, metals or other materials that exhibit charge storage capabilities. Note that semiconductor materials such as silicon and germanium may be preferable due to the potential for an over-erase situation that may occur when metal isolated storage elements are used. The pre-fabricated storage elements may be produced such that they are substantially spherical and have a maximum diameter that does not exceed 55 Angstroms. Preferably, the isolated storage elements vary in diameter by no more than ten percent.

Formation of the layer of colloidal solution 16 upon the first gate insulator layer 14 may be accomplished by wetting the first gate insulator layer 14 with the colloidal solution 16. Such wetting may be accomplished by spin-coating the colloidal solution 16 onto the first gate insulator layer 14. Thus, if the semiconductor device 10 is included in a semiconductor wafer upon which the first gate insulator layer 14 has been deposited, spin-coating of the colloidal solution 16 onto the first gate insulator layer 14 may be accomplished using standard spin-coating techniques well understood in semiconductor processing methodology. In other embodiments, the wetting of the first gate insulator layer 14 with the colloidal solution 16 may be accomplished by dipping the surface of the first gate insulator layer 14 into colloidal solution such that a layer of the colloidal solution 16 adheres to the first gate insulator layer 14.

In order to facilitate the step of wetting the first gate insulator layer 14 with the colloidal solution 16, the solvent included in the colloidal solution 16 may include a wetting promoter with respect to the material that makes up the first gate insulator layer 14. Such a wetting promoter encourages uniform distribution of the colloidal solution 16 across the surface of the first gate insulator layer 14. Such a wetting promoter may include a surfactant with hydrophilic and hydrophobic groups such that one group adheres to the surface of the first gate insulator layer 14 and promotes even distribution of the other group such that uniform distribution of the solution is achieved. In order to further promote the adhesion of the colloidal solution 16 to the first gate insulator layer 14, the first gate insulator layer 14 may be treated to promote such wetting.

The density of pre-fabricated isolated storage elements 18 within the colloidal solution 16 may be controlled to achieve desired densities of deposition when the solvent in the solution is removed. Furthermore, the specific size of each of the prefabricated isolated storage elements can also be closely controlled by selecting a selected size of prefabricated isolated storage elements from elements that have been sorted based on size through an arrested precipitation of a solution containing a variety of prefabricated isolated storage elements sizes. By using such techniques for sorting the different sized prefabricated isolated storage elements, a uniformity of size can be obtained for the prefabricated isolated storage elements included in the colloidal solution 16 such that a size variation of less than 10% (ten per cent) with respect to a mean size can be achieved.

The specific size selected for the plurality of prefabricated isolated storage elements may be on the order of 50 Angstroms in diameter. Note that the size selected may vary based on the desired electrical characteristics for the semiconductor device formed. As is apparent to one of ordinary skill in the art, the density of prefabricated isolated storage elements that may be achieved on a surface will be partially based on the size of the average storage element such that larger elements will have a lower maximum density. Smaller-sized prefabricated isolated storage elements may not be desirable in some cases, as oxidation of the storage elements of smaller sizes will remove a larger percentage of the storage elements, thus jeopardizing their functionality in the device. As such, prefabricated isolated storage elements within a range of 20 to 60 Angstroms may be desirable for many semiconductor device applications.

Deposition of the plurality of prefabricated isolated storage elements on the first gate insulator layer 14 may be completed by removing the solvent from the colloidal solution 16 such that the plurality of prefabricated isolated storage elements remain. Removing the solvent from the colloidal solution 16 may be accomplished in a non-reactive environment such that the prefabricated isolated storage elements are not degraded, where degradation in size or composition may affect their electrical characteristics jeopardizing the functionality of the semiconductor device. Such non-reactive environments for silicon prefabricated isolated storage elements may include nitrogen environments, argon environments, or other inert or non-oxidizing environments that do not contain substances that react with the silicon.

Note that the density of the prefabricated isolated storage elements which are effectively deposited on the first gate insulator layer 14 by removal of the solvent from the colloidal solution 16 will be dependent upon the density of prefabrication isolated storage elements within the colloidal solution and the amount of colloidal solution deposited on the first gate insulator layer 14 prior to removal of the solvent. Thus, varying densities of prefabricated isolated storage elements deposited can be achieved by varying either the density of prefabricated isolated storage elements in the colloidal solution 16 or by varying the amount of solution deposited before removal of the solvent.

In one example, each of the prefabricated isolated storage elements is approximately 40 Angstroms in diameter, and the isolated storage elements are separated from one another by approximately 40 Angstroms. In such an example, a coverage density greater than $10^{12}$ (ten to the twelfth) storage elements per $cm^2$ can be achieved. By using prefabricated isolated storage elements, a coverage density of $1.6 \times 10^{12}$ storage elements per $cm^2$ can be achieved using the techniques described herein. Note that this density per $cm^2$ is significantly greater than that which can be achieved using prior art techniques for depositing isolated storage elements, which are limited to a best case density of $5 \times 10^{11}$ storage elements per $cm^2$. Although higher densities may be achieved using the techniques provided herein, the proximity of the isolated storage elements in such higher density embodiments may increase the probability of lateral charge transfer between storage elements, thus degrading the beneficial effects of their isolation.

In another example that provides a similar area density, prefabricated isolated storage elements having a diameter of approximately 30 Angstroms with an average separation of about 35 Angstroms may be utilized. In such an embodiment, a density of approximately $2 \times 10^{12}$ storage elements per $cm^2$ can be achieved. Note that storage elements of this approximate diameter are capable of charge storage required to function as a portion of the floating gate within the semiconductor device. Without the utilization of prefabricated isolated storage elements, the creation of isolated storage elements on the first gate insulator layer 14 using prior art techniques would render the production of storage elements having a diameter of 30 Angstroms problematic. Furthermore, the variation in size of the storage elements produced through such prior art techniques would be significant thus inducing variation in electrical characteristics for devices formed at different locations on a semiconductor wafer.

When a semiconductor device is intended to function by switching state through the addition of a single electrical carrier, such as an electron, to each of the isolated storage elements in a floating gate structure, smaller diameter isolated storage elements may be preferable to larger diameter isolated storage elements due to the fact that increased densities of storage elements can be achieved with smaller storage elements. However, in some instances, multiple charge carriers may be required to be added to each storage element in order to achieve the state changes required in the semiconductor device. In such embodiments, larger diameter storage elements may be preferable as such larger diameter storage elements may more easily accept multiple charge carriers. Therefore, as is apparent to one of ordinary skill in the art, the average diameter of the storage element may be adjusted to suit the needs of the particular semiconductor device being produced.

A similar tradeoff exists between the number density of the storage elements and the charge retention characteristics of the set of storage elements included in the floating gate structure. Floating gates having higher number densities of storage elements may be practical in more volatile semiconductor memory structures such as dynamic random access memory (DRAM) where good charge retention, although desirable, is not as critical as in generally non-volatile memory structures such as EEPROM structures.

Figure 3:
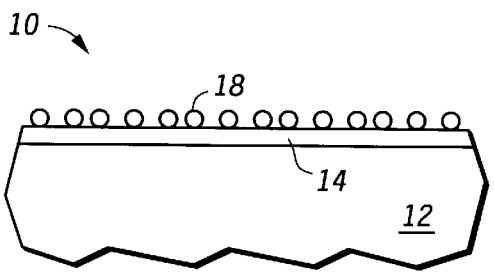
FIG. 3 illustrates a cross-sectional view of the semiconductor substrate portion of FIG. 1 upon which a plurality of isolated storage elements has been formed in accordance with a particular embodiment of the present invention.
Figure 4:
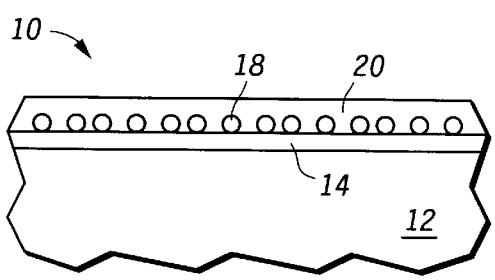
FIG. 4 illustrates a cross-sectional view of the semiconductor substrate portion of FIG. 3 upon which a control dielectric has been formed in accordance with a particular embodiment of the present invention.

FIG. 4 illustrates a cross-sectional view of the semiconductor device portion 10 of FIG. 3 upon which a second gate insulator layer 20, which may also be referred to as a control dielectric, has been formed. Thus, the second gate insulator layer 20 generally overlies the prefabricated isolated storage elements 18 and the first gate insulator layer 14. The second gate insulator layer 20 may be deposited using chemical vapor deposition (CVD), sputtering, or other deposition steps commonly used in semiconductor processing operations. The material included in the second gate insulator layer 20 may be oxide-nitride-oxide (ONO), silicon dioxide, or metal oxide. Prior to forming the second gate insulator layer 20, the individual isolated storage elements 18 may be encapsulated in order to prevent oxidation and effective reduction in size thereby. Such encapsulation is described in additional detail with respect to FIGS. 10–12 below.

Figure 5:
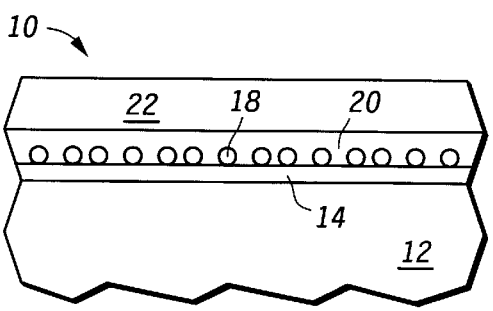
FIG. 5 illustrates a cross-sectional view of the semiconductor substrate portion of FIG. 4 upon which a gate material has been formed in accordance with a particular embodiment of the present invention.

FIG. 5 illustrates a cross-sectional view of the portion of the semiconductor device 10 of FIG. 4 where a conductive layer 22 has been deposited over the second gate insulator layer 20. The conductive layer is preferably a gate material such as doped polysilicon or metal. Deposition of the conductive layer 22 may be accomplished by CVD, or other techniques commonly used to deposit such gate materials.

Figure 6:
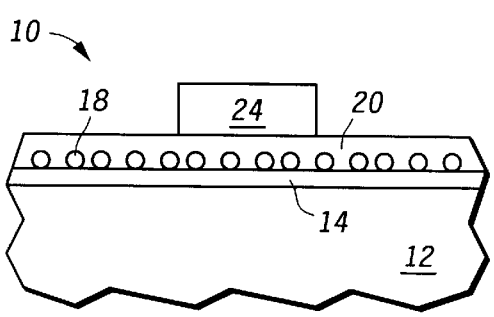
FIG. 6 illustrates a cross-sectional view of the semiconductor substrate portion of FIG. 5 where the gate material has been patterned to form a gate electrode in accordance with a particular embodiment of the present invention.

FIG. 6 illustrates a cross-sectional view of the semiconductor device 10 of FIG. 5 where a portion of the conductive layer 22 has been removed to form a gate, which may be referred to as the gate electrode 24. Formation of the gate electrode 24 defines a channel region in the semiconductor layer 12 that underlies the gate electrode 24. Etching of the conductive layer 22 to form the gate electrode 24 may be accomplished using a reactive ion etch.

Figure 7:
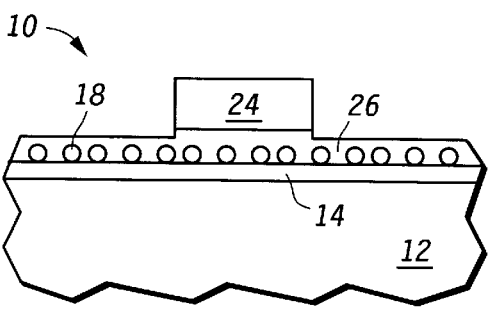
FIG. 7 illustrates a cross-sectional view of the semiconductor substrate portion of FIG. 6 where a portion of the control dielectric has been selectively removed in accordance with a particular embodiment of the present invention.

FIG. 7 illustrates a cross-sectional view of the semiconductor substrate portion 10 of FIG. 6 where a portion of the second gate insulator layer 20 has been etched to form an etched second gate insulator layer 26. The portion of the second gate insulator layer 20 that is removed to form the etched second gate insulator layer 26 is the portion that lies adjacent to the gate electrode 24. Thus, the portion of the second gate insulator layer 20 that underlies the gate electrode 24 is not etched. Such etching may be performed using reactive ion etching (RIE).

Figure 8:
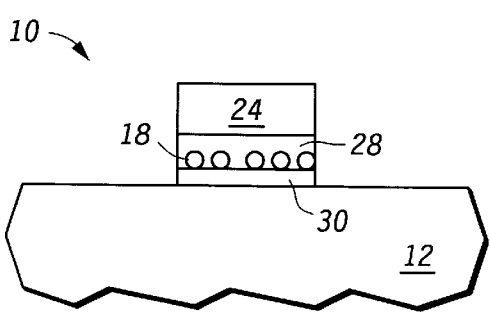
FIG. 8 illustrates a cross-sectional view of the semiconductor substrate portion of FIG. 7 after selective removal of portions of the tunnel dielectric layer, the plurality of isolated storage elements, and the layer of control dielectric in accordance with a particular embodiment of the present invention.

FIG. 8 illustrates a cross section view of the semiconductor device 10 of FIG. 7 where a portion of the plurality of isolated storage elements 18 have been reacted to form a compound which can be removed through etching operations. The portion that is reacted is the portion that underlies the portion of the second gate insulator layer 20 that was etched away to produce the etched second gate insulator layer 26 illustrated in FIG. 7. Thus, the portion of the plurality of isolated storage elements that underlies the gate electrode 24 is preferably unaffected by the reacting operation. Reacting may include reacting with oxygen, which creates silicon dioxide in the case of silicon storage elements.

Following the reacting of the portion of the plurality of isolated storage elements, the reacted portion of the plurality of isolated storage elements is removed along with a corresponding portion of the first and second gate insulator layers 26 and 14 using an etching operation. FIG. 8 shows a cross-sectional view of the resulting structure. The etching operation may be a non-selective wet etch operation. For example, in the case of silicon isolated storage elements, reacting a portion of the plurality of isolated storage elements may include reacting those storage elements with oxygen to form silicon dioxide. If the first and second gate insulator layers 26 and 14 are silicon dioxide, a wet etch operation utilizing dilute hydrofluoric acid (HF) will achieve the desired result. What is shown to remain in the cross-sectional view of FIG. 8 is the gate electrode 24, a selected portion of the second gate insulator 28, a portion of the plurality of isolated storage elements 18, and a portion of the first gate insulator 30, all of which underlie the gate electrode 24.

Figure 9:
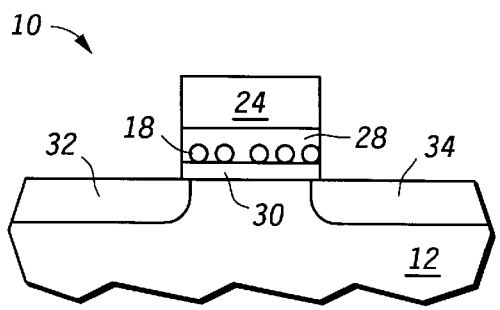
FIG. 9 illustrates a cross-sectional view of the semiconductor substrate portion of FIG. 8 where spacers, a source region, and a drain region have been formed to create a semiconductor device in accordance with a particular embodiment of the present invention.

FIG. 9 illustrates a cross-sectional view of the semiconductor substrate 10 of FIG. 8 where source and drain regions 32 and 34 have been formed to complete the structure of a field effect transistor. The source and drain regions 32 and 34 may be formed through implantation of dopant materials in the semiconductor layer 12. Formation of the source and drain regions 32 and 34 also forms the channel region that lies beneath the gate electrode 24 between the source and drain regions 32 and 34. Such a transistor structure may be produced to include field isolation regions (not shown) to isolate the transistor from neighboring devices.

Transistors such as that shown in FIG. 9 may be utilized in semiconductor memory structures such as EEPROM memories, DRAM memories, or other memory structures of varying volatility. In particular, such a transistor may be useful in the production of flash memory structures that require charge retention characteristics such that the state of the transistor can be maintained over a time period on the order of years.

Figure 10:
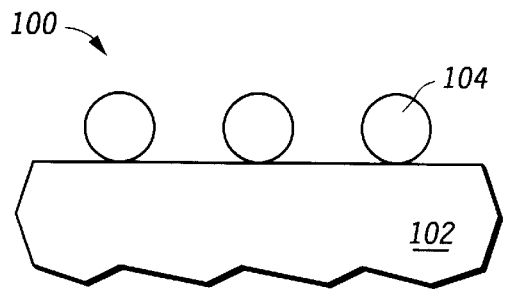
FIG. 10 illustrates an expanded cross-sectional view of a plurality of isolated storage elements formed on a tunnel dielectric in accordance with a particular embodiment of the present invention.

FIG. 10 illustrates an expanded cross-sectional view of a plurality of isolated storage elements 104 as deposited on a gate insulator layer 102. Following deposition of the isolated storage elements 104 on the insulating layer 102, the semiconductor substrate portion 100 may be exposed to ambient conditions that may result in oxidation of the isolated storage elements 104. Such oxidation may result in many undesirable effects. One undesirable effect is that the effective size of the storage elements is reduced through the consumption of silicon or other composition materials of the storage elements during such oxidation. The resulting smaller-diameter storage elements may not provide the charge retention characteristics desired for the semiconductor device within which the storage elements will be included.

Another concern that oxidation of the isolated storage elements presents is that it effectively increases the thickness of the underlying insulating layer 102, which may be formed of a material such as silicon oxide. Thus, in the case where the storage elements are silicon, the silicon oxide created through the oxidation that occurs in the ambient environment generates additional silicon oxide in the area where the storage elements 104 borders the underlying insulation layer 102. Such an effective increase in the thickness of the underlying insulating layer 102 can have significant effects on the electrical characteristics of the semiconductor device being produced.

Figure 11:
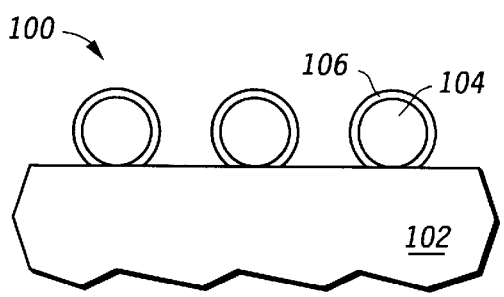
FIG. 11 illustrates an expanded cross-sectional view of the structure in FIG. 10 where the isolated storage elements have been encapsulated in an encapsulation layer in accordance with a particular embodiment of the present invention.

In order to avoid oxidation that may occur during the deposition of the second gate insulation layer (which may expose the storage elements to an oxidizing ambient), the storage elements 104 may be encapsulated with an encapsulation layer 106 shown in FIG. 11. Such an encapsulation may be resistive to oxidation such that it is not degraded in the ambient environment. The encapsulation layer 106 may be formed of silicon nitride in the case of silicon isolated charge storage elements. Silicon nitride may be formed on surface of the storage elements by exposing the storage elements to a nitridingambient at high temperature. Such an ambient may include ammonia, nitrous oxide, or other nitrogen compounds that are reactive to silicon in a manner that can be controlled. Additional encapsulation techniques are described in detail in a co-pending patent application entitled "MEMORY DEVICE THAT INCLUDES PASSIVATED NANOCLUSTERS AND METHOD FOR MANUFACTURE" that has an attorney docket number of SC11062TP, was filed on the same date as the present application, and is incorporated herein by reference.

Preferably, the formation of the encapsulation layer 106 can be controlled such that the thickness of the encapsulation layer 106 is on the order of five Angstroms or no greater than 10 percent of the diameter of the isolated storage elements 104. In the case where the storage elements 104 are silicon storage elements, the nitriding process used to create the encapsulation layer 106 in the case of a silicon nitriding encapsulation layer is typically self-limiting. Thus, in a controlled environment, the maximum growth of silicon nitride on the silicon storage elements may be self-limited with respect to temperature of nitridation.

Figure 12:
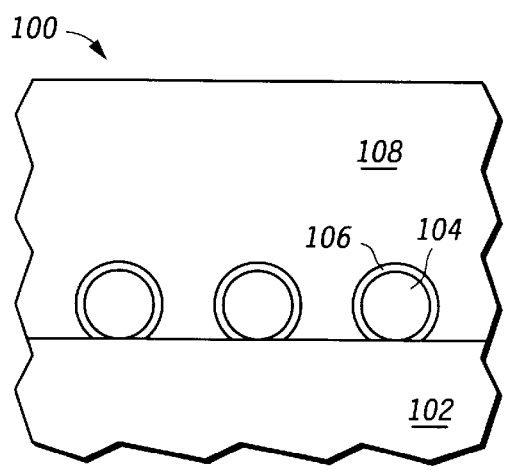
FIG. 12 illustrates an expanded cross-sectional view of the structure of FIG. 11 where a control dielectric has then formed overlying the tunneling oxide in accordance with a particular embodiment of the present invention.

FIG. 12 illustrates a cross-sectional view of the semiconductor substrate portion 100 of FIG. 11 over which a second gate insulation layer 108 has been formed. In prior art systems that did not include the encapsulation of the isolated storage elements 104 with an encapsulation layer 106, the formation of the second gate insulation layer 108 could result in ambient exposure of the storage elements 104 that produces oxidation. Including the encapsulation layer 106 prevents oxidation or other degradation due to ambient exposure of the storage elements such that the diameter of the storage elements is maintained and no uncontrolled increase in the underlying gate insulation layer occurs.

The present invention provides a technique for forming a plurality of isolated storage elements on an underlying insulation layer in a controlled manner such that storage element densities not possible using prior art techniques can be achieved. By utilizing pre-formed storage elements of a known size and including these prefabricated storage elements in a colloidal solution of a known density, deposition of the storage elements in a controlled manner upon the insulating layer is possible. The capability of depositing such storage elements in such a controlled manner allows for high densities of uniformly sized storage elements. Such deposition techniques make the production of low voltage transistors with desirable electrical characteristics possible such that memory structures having desirable data retention characteristics and minimal voltage requirements can be produced.

In the foregoing specification, the invention has been described with reference to specific embodiments. However, one of ordinary skill in the art appreciates that various modifications and changes can be made without departing from the scope of the present invention as set forth in the claims below. For example, the substrate may be a silicon on insulator (SOI) or all silicon, but in either case the transistors are formed in a silicon layer on the surface. In the case of SOI, the silicon layer on the surface overlies an insulating layer. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a memory device, comprising the steps of:

providing a silicon layer;

forming a first gate insulator over the silicon layer;

depositing a plurality of pre-fabricated isolated storage elements on the first gate insulator;

forming a second gate insulator over the plurality of pre-fabricated isolated storage elements;

depositing a conductive layer over the second gate insulator;

etching the conductive layer to form a gate electrode and define a channel region in the silicon layer under the gate electrode;

etching at least a portion of the second gate insulator adjacent to the gate electrode;

reacting a portion of the plurality of pre-fabricated isolated storage elements that is under said portion of the second gate insulator to form reacted storage elements;

removing the reacted storage elements and the first gate insulator adjacent to the gate electrode; and forming a source and a drain in the silicon layer and adjacent to the channel region.

2. The method of claim 1, further comprising encapsulating each of the plurality of pre-fabricated isolated storage elements with an encapsulation material.

3. The method of claim 2, wherein the encapsulation material comprises silicon nitride.

4. The method of claim 2, wherein each of the plurality of pre-fabricated isolated storage elements is substantially spherical and has a diameter that is less than fifty-five Angstroms.

5. The method of claim 4, wherein the encapsulation material has a thickness no greater than ten percent of the diameter of each pre-fabricated isolated storage element of the plurality of pre-fabricated isolated storage elements.

6. A method for making a semiconductor device, comprising the steps of:

providing a semiconductor layer;

depositing a first gate insulator over the semiconductor layer;

depositing a plurality of pre-fabricated nano-crystals over the first gate insulator;

depositing a second gate insulator over the pre-fabricated nano-crystals;

forming a gate electrode over the second gate insulator; and forming a source and a drain in the semiconductor layer with a channel region therebetween, wherein the channel region is under the gate electrode.

7. The method of claim 6 wherein the step of depositing the plurality of pre-fabricated nano-crystals comprises:

forming a colloidal solution with the plurality of pre-fabricated nano-crystals in a solvent;

wetting the first gate insulator with the colloidal solution; and removing the solvent to leave the plurality of pre-fabricated nano-crystals on the first gate insulator.

8. The method of claim 7 wherein the step of wetting comprises spin-coating.

9. The method of claim 7, wherein the first gate insulator comprises a first material and wherein the solvent comprises a wetting promoter with respect to the first material.

10. The method of claim 9, wherein the first material comprises silicon oxide and the wetting promoter comprises a surfactant.

11. The method of claim 10, wherein the step of removing the solvent is performed in a non-oxidizing environment.

12. The method of claim 11, wherein the second insulator comprises a layer of oxide-nitride-oxide.

13. The method of claim 6, wherein the plurality of pre-fabricated nano-crystals comprises a plurality of pre-fabricated isolated storage elements.

14. The method of claim 13, wherein each of the plurality of pre-fabricated isolated storage elements includes a semiconductor material.

15. The method of claim 14, wherein the semiconductor material is silicon.

16. The method of claim 14, wherein the semiconductor material is germanium.

17. A method useful in making a semiconductor device, comprising the steps providing a semiconductor layer;

depositing a first insulator over the semiconductor layer; and depositing a plurality of pre-fabricated nano-crystals on the first insulator.

18. The method of claim 17, further comprising the steps of:

forming a gate over and insulated from the plurality of pre-fabricated nano-crystals; and forming a source and a drain in the semiconductor layer with a channel therebetween, wherein the channel is under the gate.

19. The method of claim 17 wherein the step of depositing the plurality of pre-fabricated nano-crystals comprises:

forming a colloidal solution with the plurality of pre-fabricated nano-crystals in a solvent;

wetting the first insulator with the colloidal solution; and removing the solvent to leave the plurality of pre-fabricated nano-crystals on the first insulator.

20. The method of claim 19 wherein the step of wetting comprises spin-coating.

21. The method of claim 19, wherein the first insulator comprises a first material and wherein the solvent comprises a wetting promoter with respect to the first material.

* * * * *